United States Patent [19]
Yamaha

[11] Patent Number: 5,593,925
[45] Date of Patent: Jan. 14, 1997

[54] SEMICONDUCTOR DEVICE CAPABLE OF PREVENTING HUMIDITY INVASION

[75] Inventor: Takahisa Yamaha, Hamamatsu, Japan

[73] Assignee: Yamaha Corporation, Japan

[21] Appl. No.: 279,338

[22] Filed: Jul. 22, 1994

[30] Foreign Application Priority Data

Jul. 24, 1993 [JP] Japan .................................. 5-202702

[51] Int. Cl.$^6$ .............................................. H01L 21/304
[52] U.S. Cl. ........................ 437/209; 437/226; 437/227; 148/DIG. 28
[58] Field of Search .................................. 437/209, 211, 437/214, 217, 219, 220, 226, 227; 148/DIG. 28

[56] References Cited

U.S. PATENT DOCUMENTS

| | | | |
|---|---|---|---|
| 4,925,808 | 5/1990 | Richardson | 437/227 |
| 5,017,512 | 5/1991 | Takagi | 432/226 |
| 5,024,970 | 6/1991 | Mori | 437/226 |
| 5,036,382 | 7/1991 | Yamaha . | |
| 5,132,252 | 7/1992 | Shiraiwa et al. | 437/227 |
| 5,136,354 | 8/1992 | Morita et al. | 437/226 |
| 5,217,916 | 6/1993 | Anderson et al. | 437/226 |
| 5,300,816 | 4/1994 | Lee et al. | 257/797 |
| 5,414,297 | 5/1995 | Morita et al. | 437/226 |

FOREIGN PATENT DOCUMENTS 5-267257  10/1993  Japan .

*Primary Examiner*—Tom Thomas
*Assistant Examiner*—Kevin M. Picardat

[57] ABSTRACT

In an IC chip having an interlevel insulation film constituted by a first level silicon oxide film, a spin-on-glass film, a second level silicon oxide film, the SOG film is partially removed in a buffer region of a closed loop shape inside of the chip periphery and surrounding the chip inner region. The second level silicon oxide film and a passivation insulation film are formed covering the SOG film and buffer region. Water contents are intercepted by the buffer region and will not reach the element region. It is therefore possible to prevent an inversion of the conductivity type at the surface of a well region in the element region or a corrosion of wiring layers, thereby improving the reliability of an IC device.

19 Claims, 13 Drawing Sheets

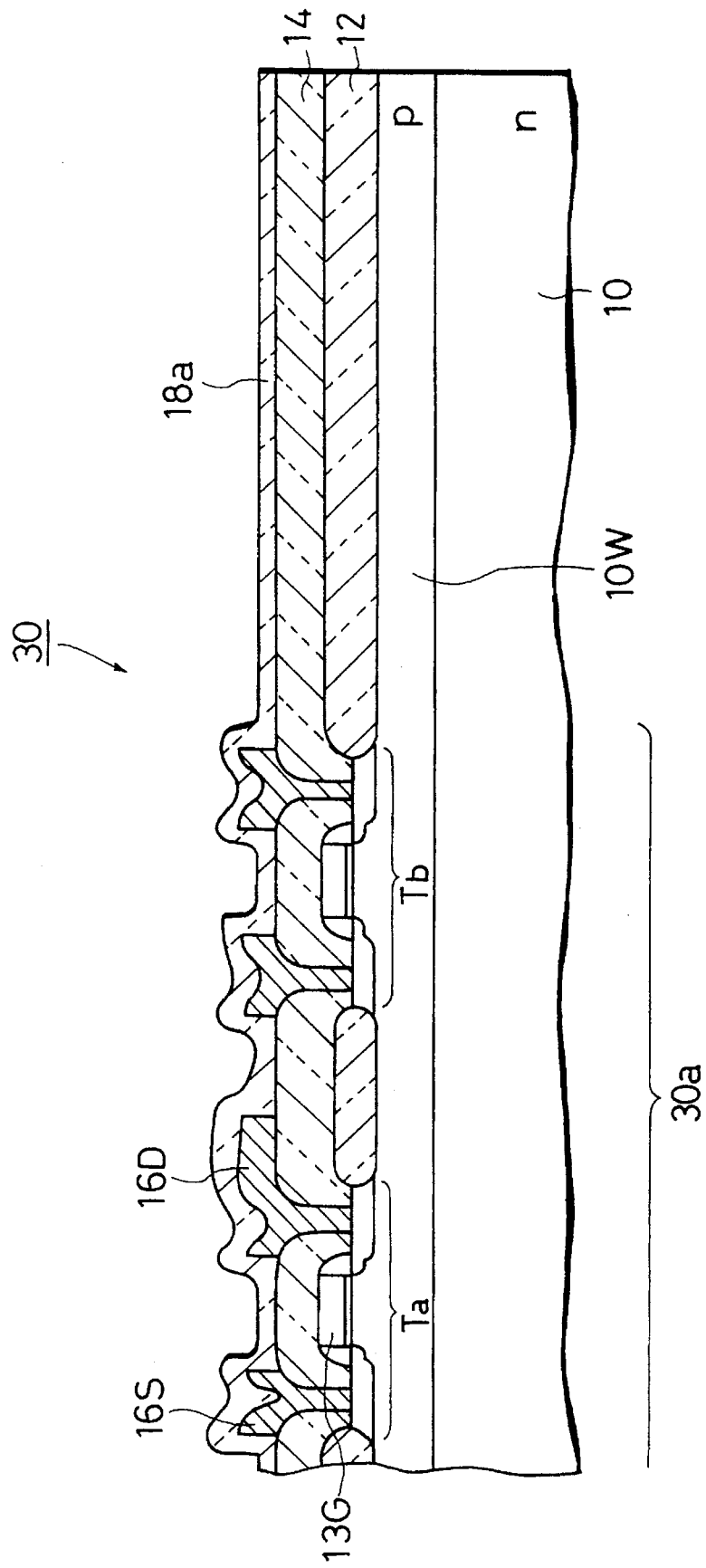

SEMICONDUCTOR DEVICE CAPABLE OF PREVENTING HUMIDITY INVASION

BACKGROUND OF THE INVENTION a) Field of the Invention

The present invention relates to a semiconductor device including an integrated circuit (IC) chip, and more particularly to a semiconductor device having a coated insulation film constituting an interlevel insulation film of an IC chip.

b) Description of the Related Art

As a conventional protective structure for an IC chip, a seal ring structure such as shown in FIGS. 3 and 4 is known.

Referring to FIG. 4, a plurality of chip inner regions 30A, 30B are formed on the surface of a semiconductor wafer 10. Each chip inner region has an IC constituted by a number of circuit elements and multi-layer wirings. The periphery of each chip inner region is provided with a seal ring structure shown in FIG. 3 so as to prevent external water contents and impurities from invading into the chip inner region.

The seal ring structure is generally formed at the interface between a scribing region 32A(32B) where the silicon surface is exposed and the chip inner region 30A(30B) where a field insulation film 12 is formed. A first interlevel insulation film 14 covering the ends of the field insulation film 12 formed on the substrate surface and surrounding the chip inner region 30A, a first level wiring (seal ring) layer 16, a second interlevel insulation film 18, a second level wiring layer (seal ring) 20, and a passivation insulation film 22, are formed in this order from the bottom. The passivation insulation film 22 is commonly made of a silicon nitride film formed by plasma chemical vapor deposition (CVD).

As shown in FIG. 4, a wafer substrate 10 including each chip inner region 30A, 30B and its peripheral seal ring region is diced along crossed scribing regions 32A, 32B to form separate IC chips. The wafer 10 may be severed at any area within the scribing region 32.

With the conventional seal ring structure, as shown in FIG. 4, a notch X reaching the chip inner region 30A is formed sometimes when dicing the wafer. FIG. 5 shows an IC chip 30 in which such a notch X exposes the ends of the insulation films 12, 14, and 18 at the chip periphery 30E. Like components to those shown in FIG. 3 are represented by identical reference numerals.

Referring to FIG. 5, a p-type well region 10W is formed on the surface of an n-type semiconductor substrate MOS transistors Ta, Tb of a lightly doped drain (LDD) structure are formed on the surface of the well region 10W within moats surrounded by the field insulation film 12. The region 30a in which IC elements such as transistors Ta, Tb are formed is called an element region.

The first interlevel insulation film 14 is interposed between gate electrode layers 13G of transistors Ta, Tb and first level wiring layers 16S, 16D, and made of, for example, boron phosphorus silicate glass (BPSG). The first level wiring layers 16S and 16D are used as source and drain wirings.

The second interlevel insulation film 18 is interposed between first level wiring layers 16S, 16D and second level wiring layers 20D. The second interlevel insulation film 18 is formed, for example, by a flat spin-on-glass (SOG) film 18b and a pair of silicon oxide films 18a and 18c sandwiching the SOG film 18b. The wiring layer 20D is connected through a via hole 18P formed in the insulation film 18 to the wiring layer 16D, and used as the drain wiring.

If the SOG film 18 is exposed at the chip periphery 30E, external water contents ($H_2O$) invades sometimes into the chip inner region via the SOG film 18b. If an organic SOG film is used as the SOG film, a possibility of invasion of water contents becomes very high. Invaded water contents rapidly diffuse in the SOG film 18b and reach the element region 30a. Water contents diffused in the SOG film 18b gradually diffuse downward so that fixed positive charges are generated in the field insulation film 12. As a result, the conductivity type of the surface of the p-type well region 10W is inverted to an n-type, allowing a leak current $I_L$ to flow, for example, between the transistors Ta and Tb and hindering a normal transistor operation.

Water contents diffused in the SOG film 18b also reach the wiring layers 16S, 16D, 20D made of, for example, Al or Al alloy. These wiring layers are sometimes corroded, lowering the reliability thereof.

In order to solve the above problems, the widths (generally in the order of 100 μm) of the scribing regions 32A, 32B may be widened. However, this approach reduces the number of chips obtainable from one wafer, and is not a practical solution.

SUMMARY OF THE INVENTION

It is an object of the present invention to provide a novel semiconductor device capable of preventing water contents from invading from a notch, without broadening the width of a scribing region.

According to one aspect of the present invention, there is provided a method for manufacturing a semiconductor device, comprising the steps of: (a) providing a semiconductor wafer having a plurality of dies to be severed therefrom, each of the dies having an underlying structure; (b) forming a first insulating layer over the underlying structure of the plurality of dies; (c) forming a second insulating layer on the first insulating layer, the second insulating layer having moisture permeability; and (d) removing the second insulating layer from a periphery of the dies.

With the structure described above, a coated insulation film such as SOG does not expose at the periphery of the substrate so that external water contents cannot invade into the element region. The conductivity inversion or wiring corrosion in the element region can thus be suppressed. Fixed positive charges are not generated in the field insulation film under the area where the coated insulation film was removed, thereby realizing a high reliability IC device. Since it is not necessary to broaden the scribing region, the number of chips per one wafer is not reduced.

BRIEF DESCRIPTION OF THE DRAWINGS

FIGS. 1A to 1G are cross sectional views of a substrate explaining the steps of manufacturing an IC chip according to an embodiment of the present invention.

FIGS. 1H to 1J are cross sectional views of a substrate explaining the steps of manufacturing an IC chip according to another embodiment of the present invention.

DETAILED DESCRIPTION OF THE PREFERRED EMBODIMENTS

Figure 5:
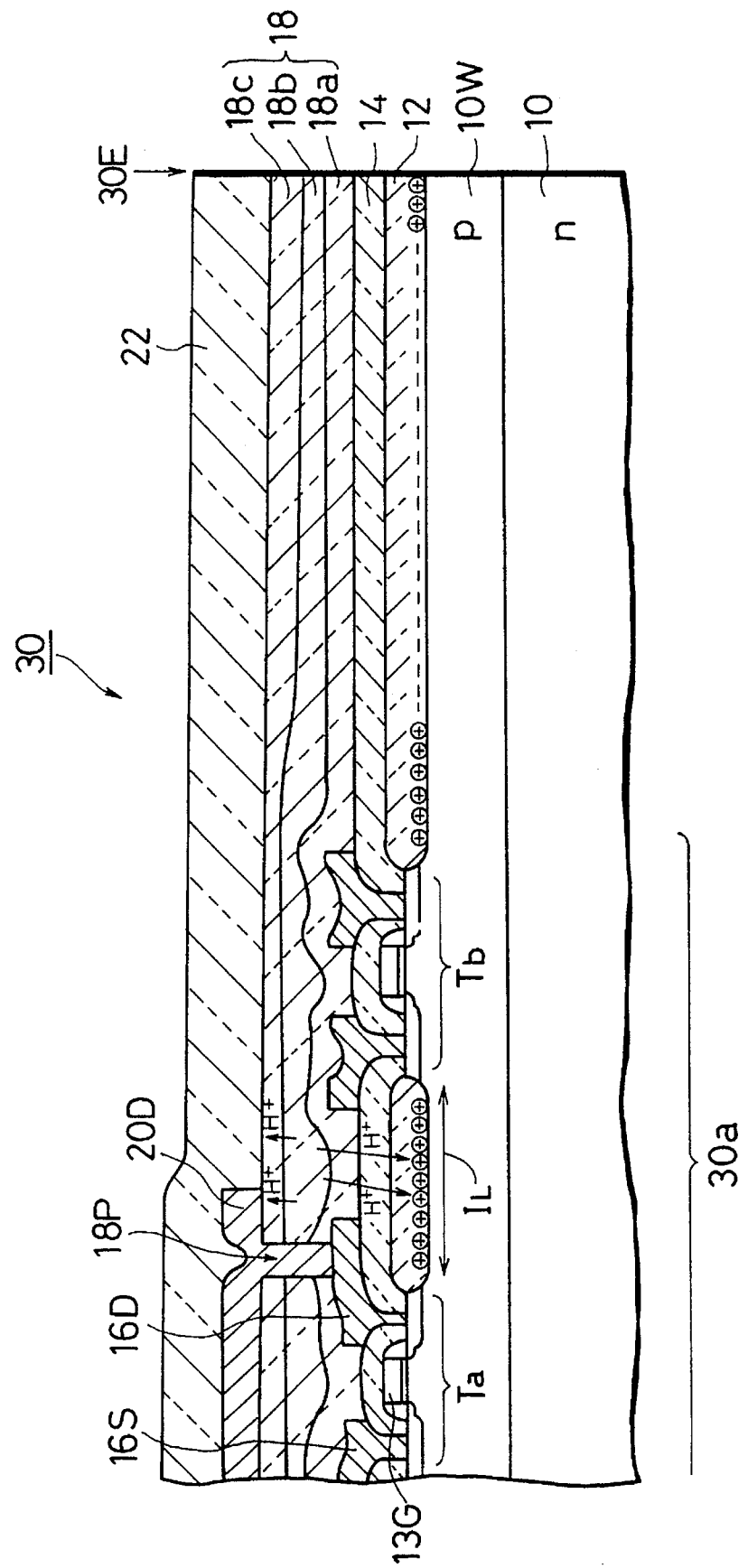
FIG. 5 is a cross sectional view of a substrate explaining a conductivity inversion phenomenon of a conventional IC chip.

FIGS. 1A to 1G show an IC chip according to an embodiment of the invention. Like elements to those shown in FIG. 5 are represented by identical reference numerals, and the detailed description thereof is omitted.

Figure 1A:
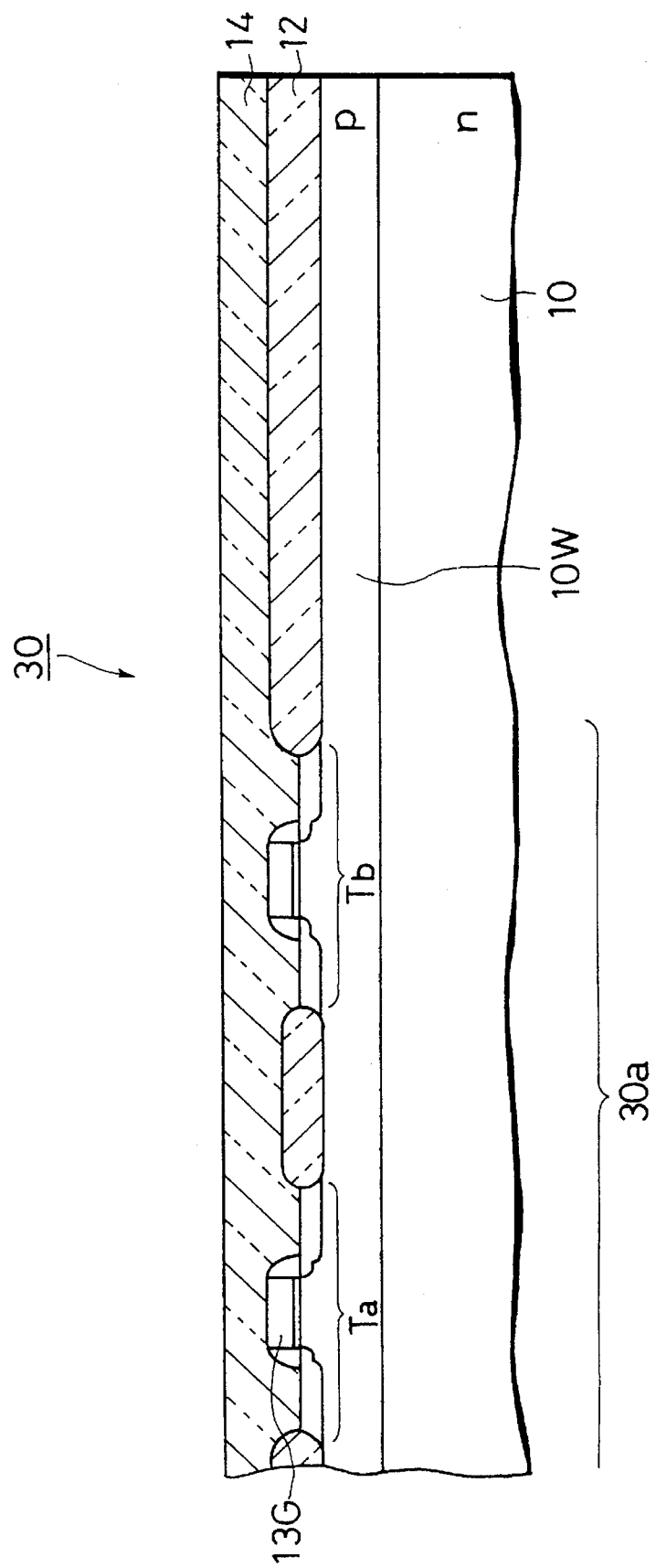

Referring to FIG. 1A, an IC chip 30 has an n-type semiconductor substrate 10, twin wells (tubs), i.e., a p-type well region 10W, and an n-type well region (not shown) a field insulation film 12, and the like. Circuit elements such as MOS transistors Ta, Tb of a lightly doped drain (LDD) structure are formed in an element region 30a.

A first interlevel insulation film 14 is formed on the substrate surface. This film 14 is formed by sequentially depositing PSG and BPSG to the thicknesses of 100 nm and 600 nm, respectively, and heating the substrate to melt and flow BPSG at 1000° C.

Figure 1B:
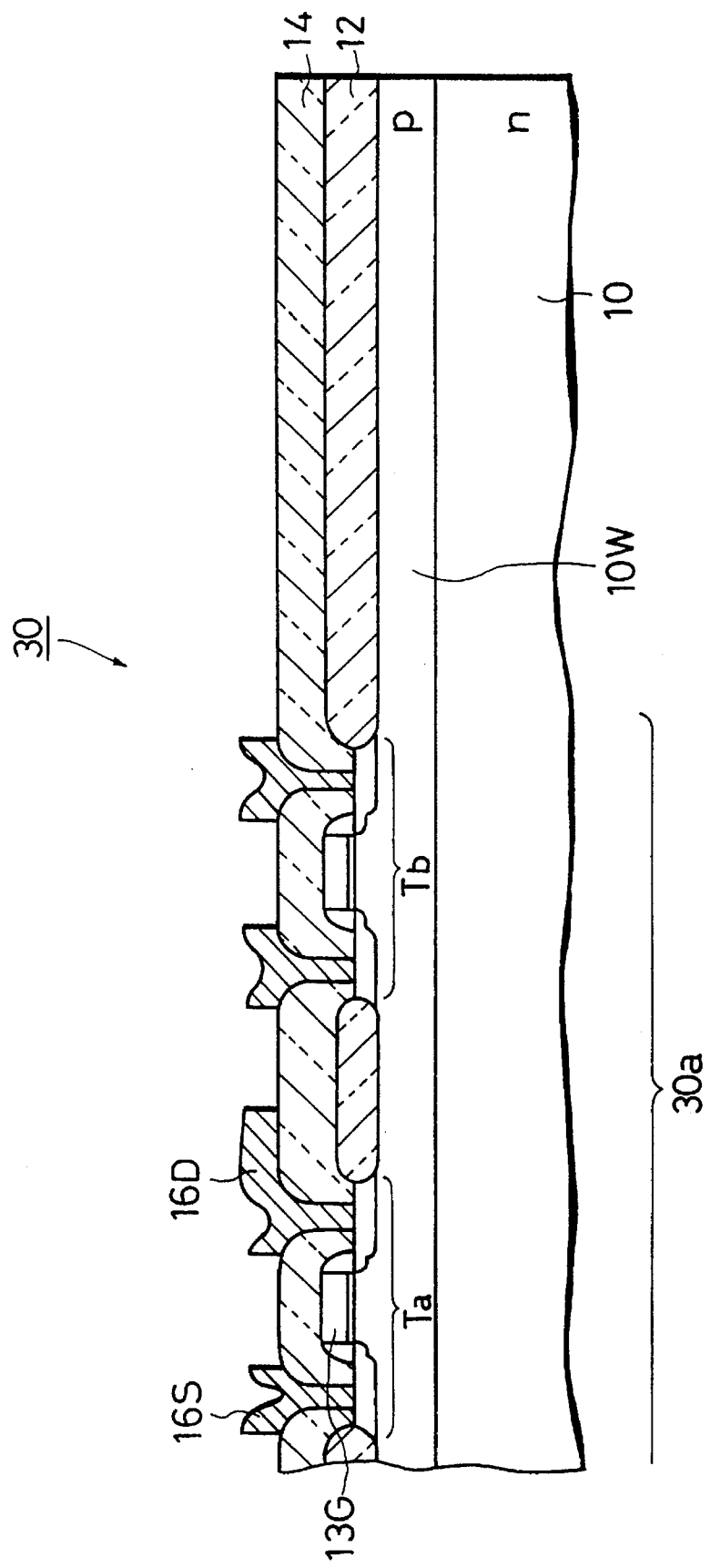

As shown in FIG. 1B, after necessary contact holes are formed in the insulation film 14, WSi, Al alloy (e.g., Al-Si-Cu), and tungsten silicide (WSi) are sequentially deposited on the substrate surface by sputtering or the like, and the deposited layer is patterned to form first level wiring layers 16S, 16D which are used as source and drain wirings.

Figure 1D:
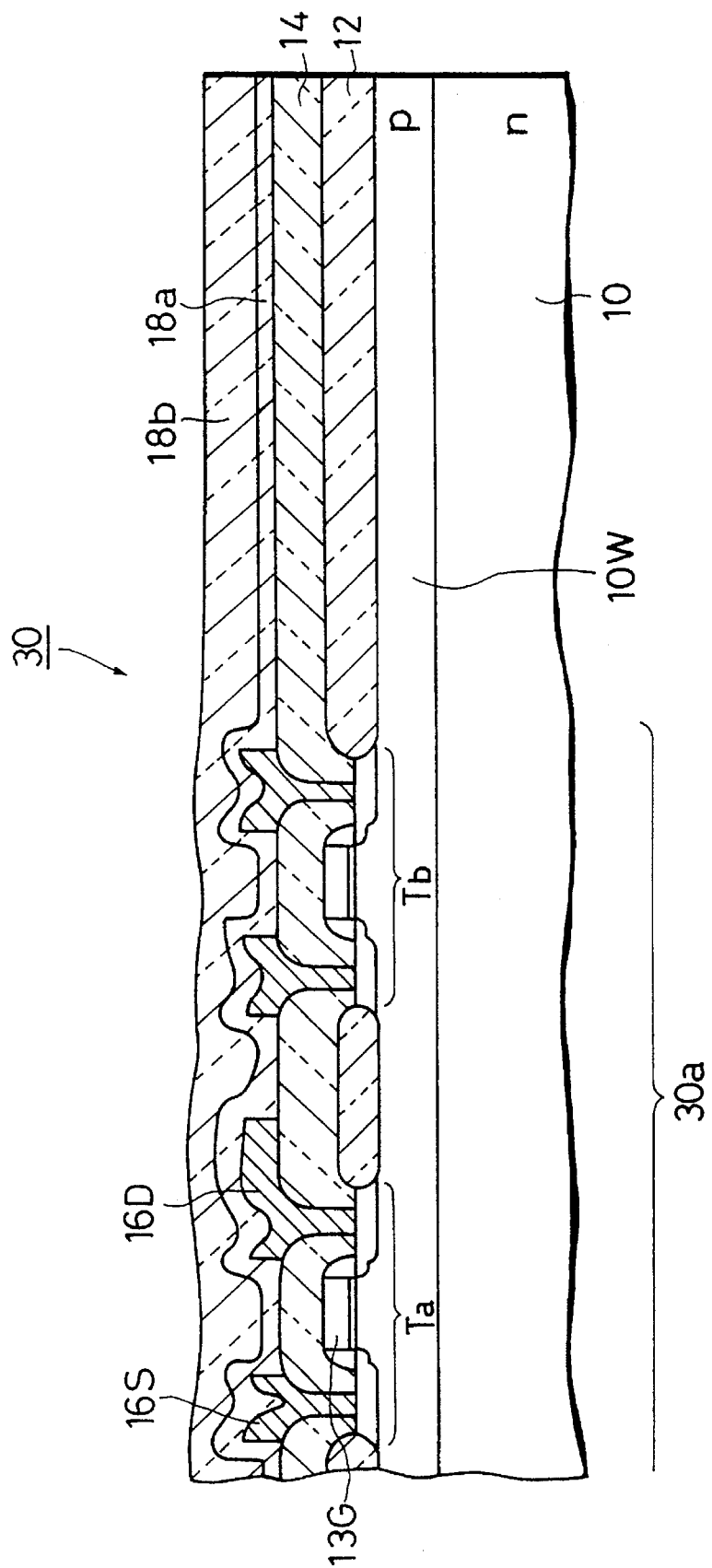

Next, as shown in FIG. 1C, in order to form a second interlevel insulation film 18 on the substrate surface, first a silicon oxide film 18a is formed by CVD to a thickness of 500 nm. Thereafter, as shown in FIG. 1D, an SOG film 18b is coated to a thickness of about 300 nm and cured at a temperature of 400° C. The SOG film 18b may be an organic SOG film, an inorganic SOG film, or a laminated film of these films. Organic SOG is prepared by mixing solvent with organic glass made of $R_nSi(OH)_{4-n}$ where R stands for —$CH_3$, —$C_6H_5$, or —$C_2H_5$. Inorganic SOG is prepared by mixing solvent with $Si(OH)_4$.

Figure 1E:
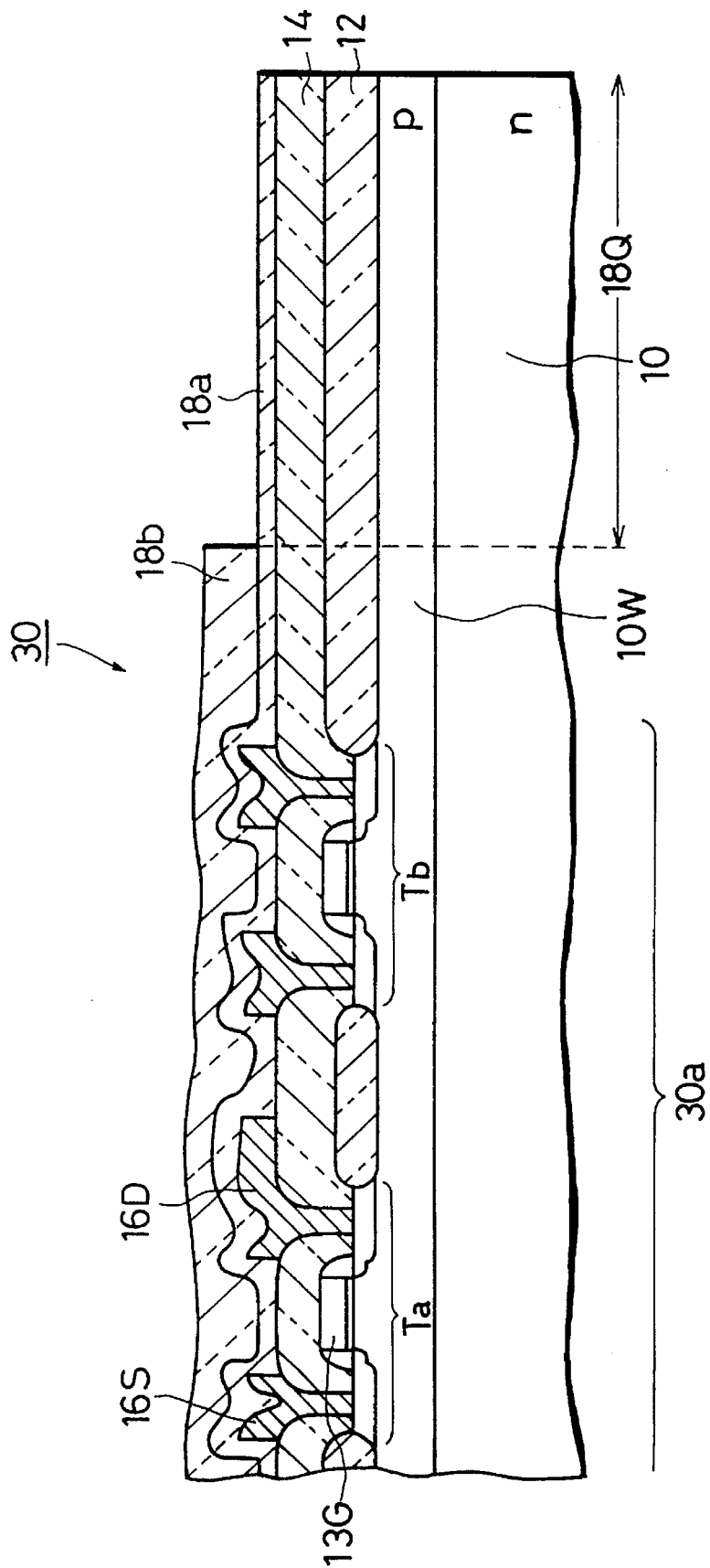
Figure 2A:
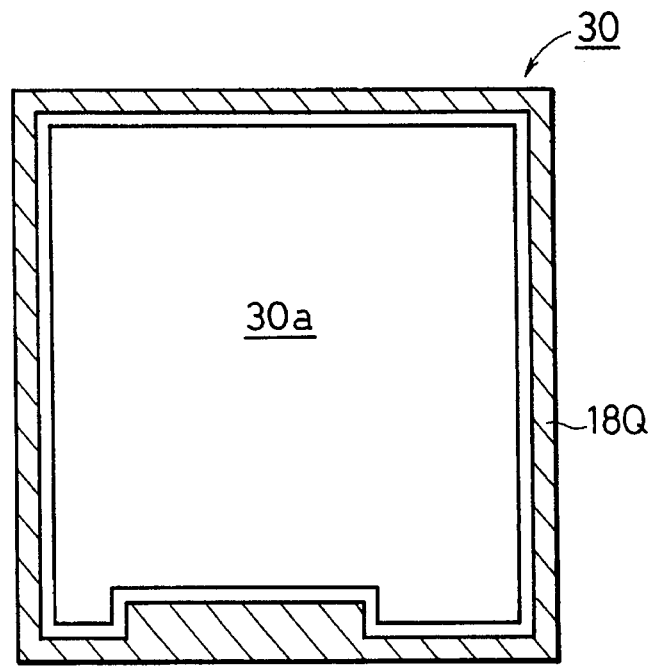
FIG. 2A and 2B are top views of the IC chip shown in FIGS. 1E.
Figure 2B:
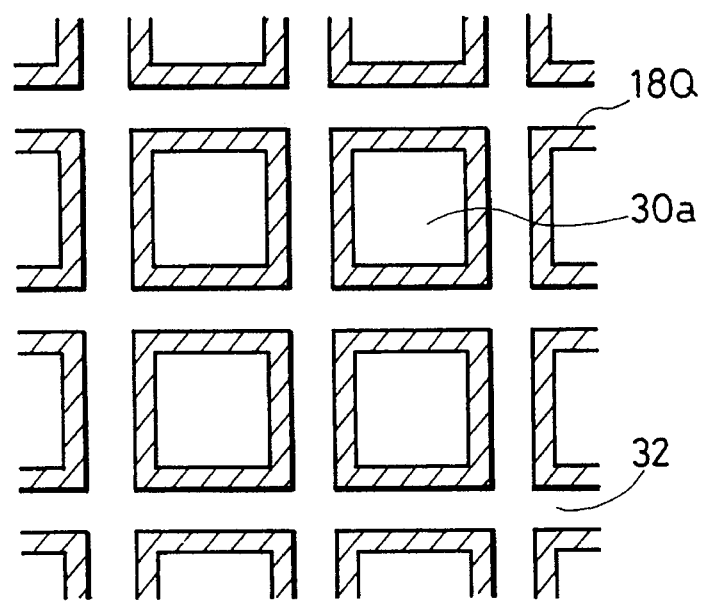

Next, as shown in FIG. 1E, the SOG film 18b is partially removed to form a buffer region 18Q of a closed loop shape inside the chip periphery 30E and along the periphery of the element region 30a, as indicated by the hatching area shown in FIG. 2A and 2B. Each of a plurality of chip areas to be severed as a die from a wafer has the element region 30a and the buffer region 18Q of a closed loop shape. A plurality of chip areas as shown in FIG. 2A are arranged in a wafer along with scribe regions 32 as shown in FIG. 2B. The SOG film 18b is partially removed by photolithography and dry etching technique. The conditions for dry-etching SOG film are, for example, a mixed gas of $CF_4$, $CHF_3$, and He at flow rates of 24, 16, and 88 sccm, respectively, a total pressure of 260 Pa, and an RF power of 250 W. The buffer region 18Q with the SOG film 18b having been removed surrounds the chip inner region. The width of the buffer region 18Q is set wider than a width of a notch formed in a general case. Preferably, the SOG film is removed by a width of about 50 μm inside of the end 30E of the scribing region to form the buffer region 18Q. Generally, elements and wirings are not formed in this buffer region 18Q, but only the field insulation film is formed. In this manner, by partially removing the SOG film 18b which has moisture permeability, the buffer region 18Q capable of preventing moisture invasion can be formed.

Figure 1F:
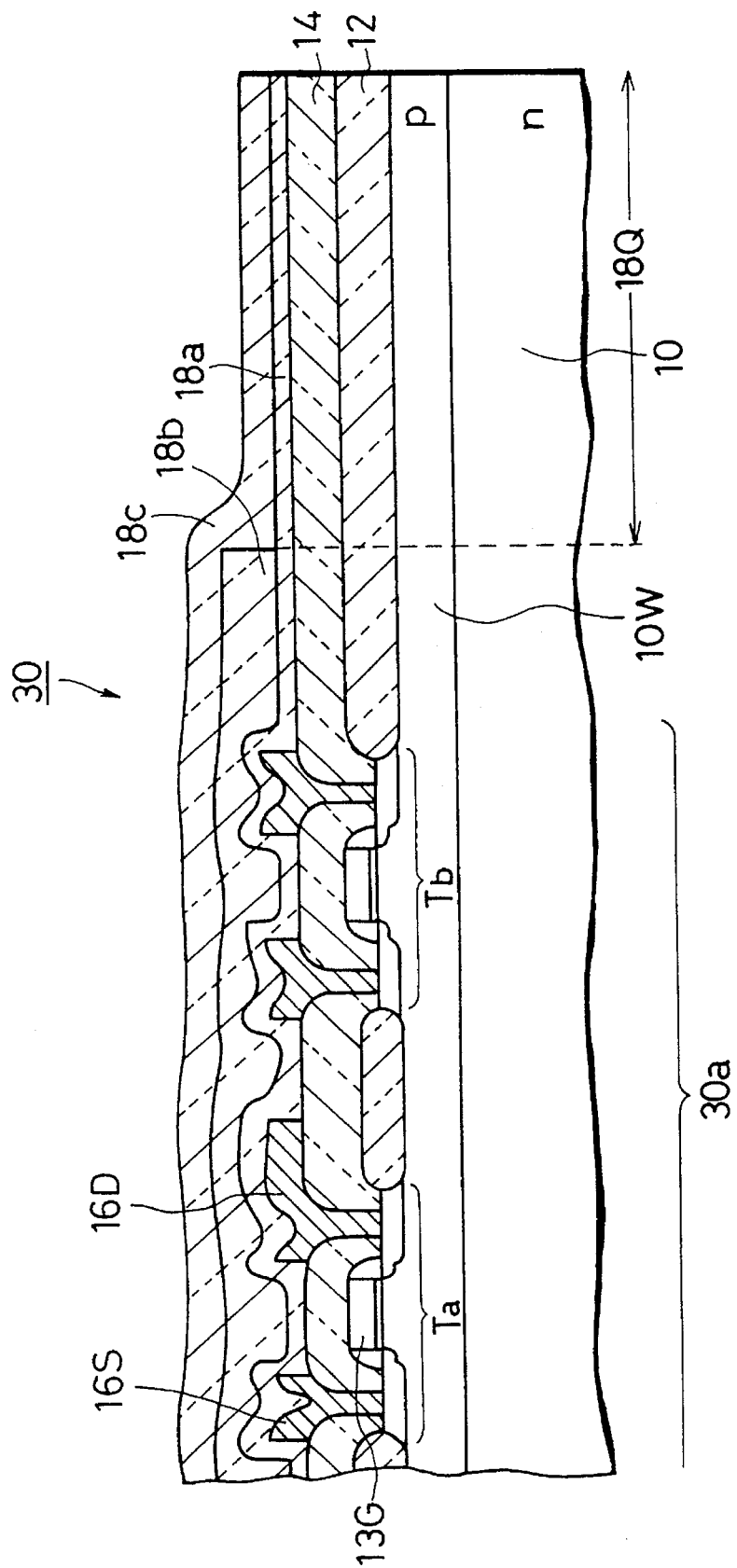

Thereafter, as shown in FIG. 1F, a silicon oxide film 18c is formed to a thickness of 400 nm by plasma CVD so as to cover the SOG film 18b and buffer region 18Q. The buffer region 18Q with the SOG film having been removed functions as a moisture invasion preventing region, and is not formed with wiring layers or the like.

A notch formed at a chip periphery and reaching the element region can be visually inspected. Even if there is a notch which cannot be visually inspected, such as a notch having a width of 10 to 20 μm from the chip periphery (the end of the scribing region), moisture contents in the air does not invade from the chip periphery, because the SOG film having a moisture permeability has been removed by about 50 μm according to this embodiment. Therefore, the performance of the IC device is not damaged.

Figure 1G:
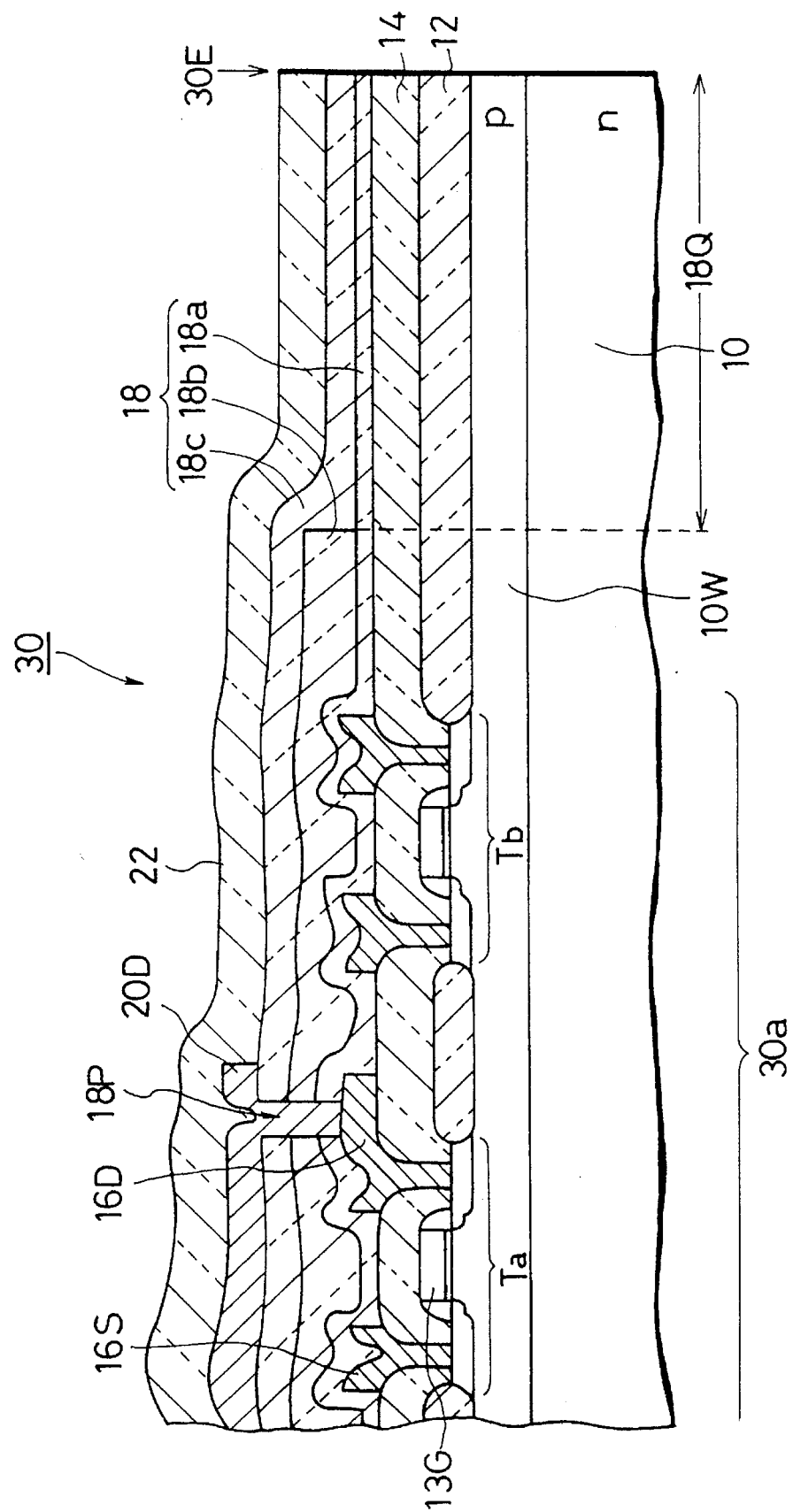

Next, as shown in FIG. 1G, a via hole 18P which connects a lower wiring layer with an upper wiring layer therethrough is formed in the interlevel insulation film 18 by dry etching or the like using a resist layer as an etching mask. A wiring layer 20D is then formed on the substrate surface by sputtering and patterning an Al alloy (e.g., Al-Si-Cu) film. The wiring layer 20D is connected through the via hole 18P to the wiring layer 16D and used as the drain wiring.

Figure 3:
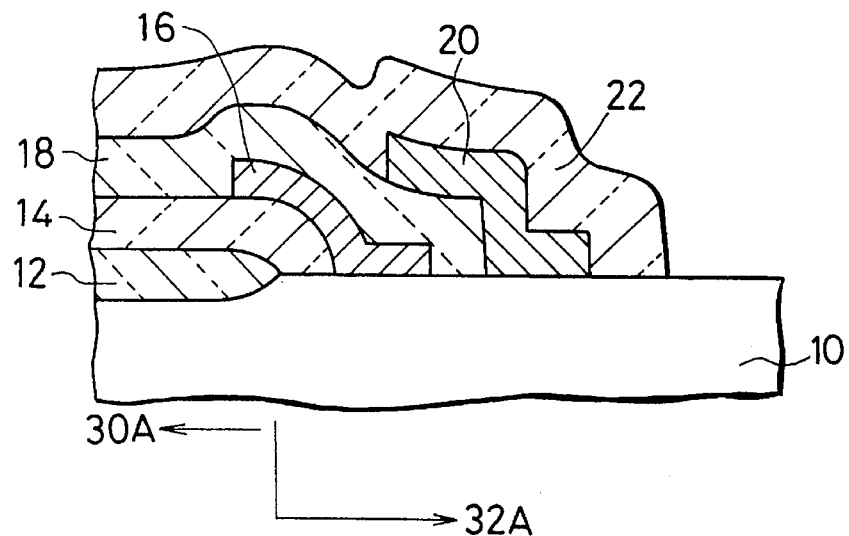
FIG. 3 is a cross sectional view of a substrate having a conventional IC chip protective structure.

Thereafter, a passivation insulation film 22 is formed by depositing silicon nitride on the substrate surface by plasma CVD. The periphery of the chip inner region may be formed with a seal ring structure such as shown in FIG. 3. In this case, the wiring layers 16 and 20 are formed by the same processes as the wiring layers 16S and 20D.

Figure 1H:
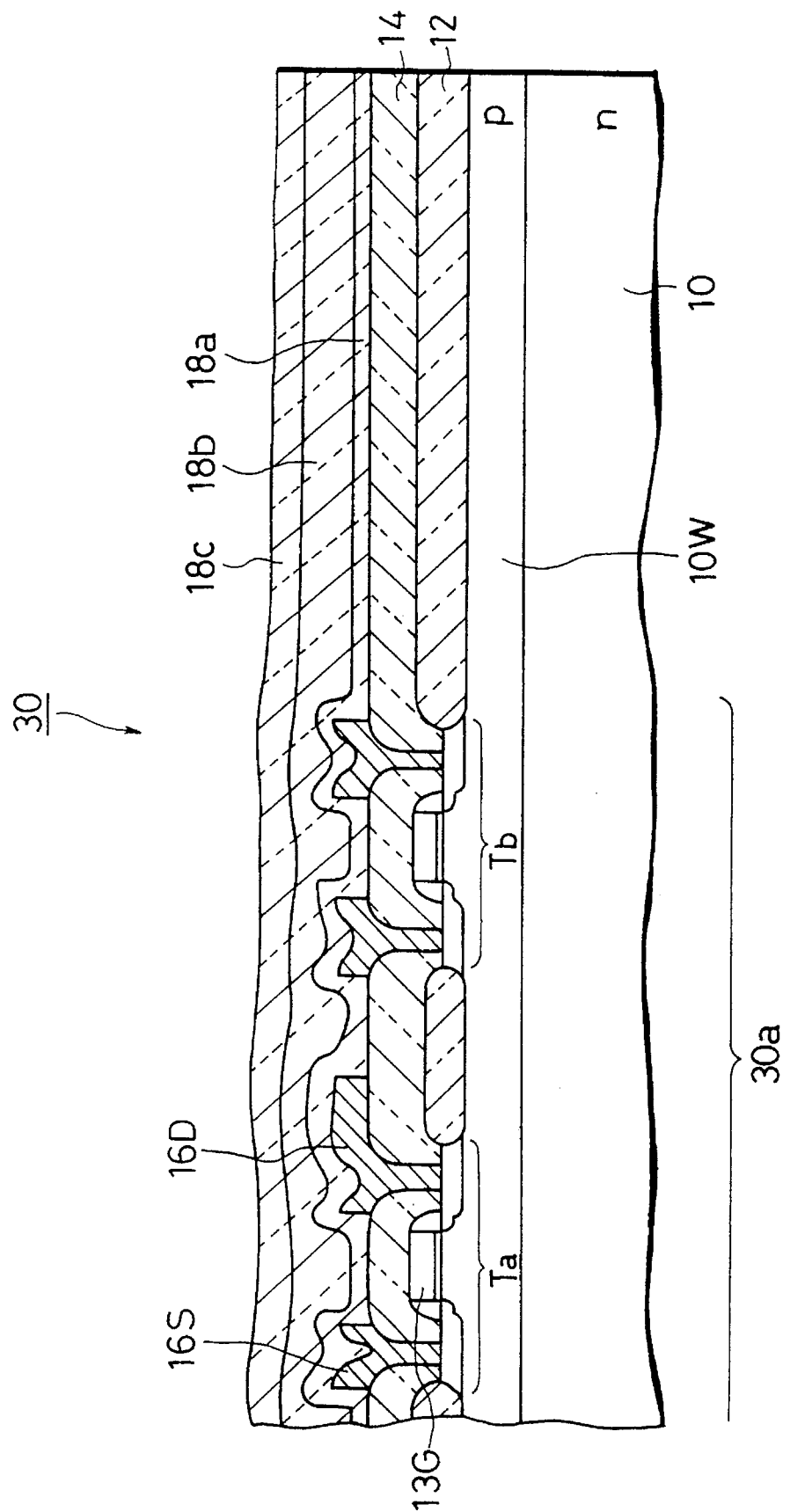
Figure 11:
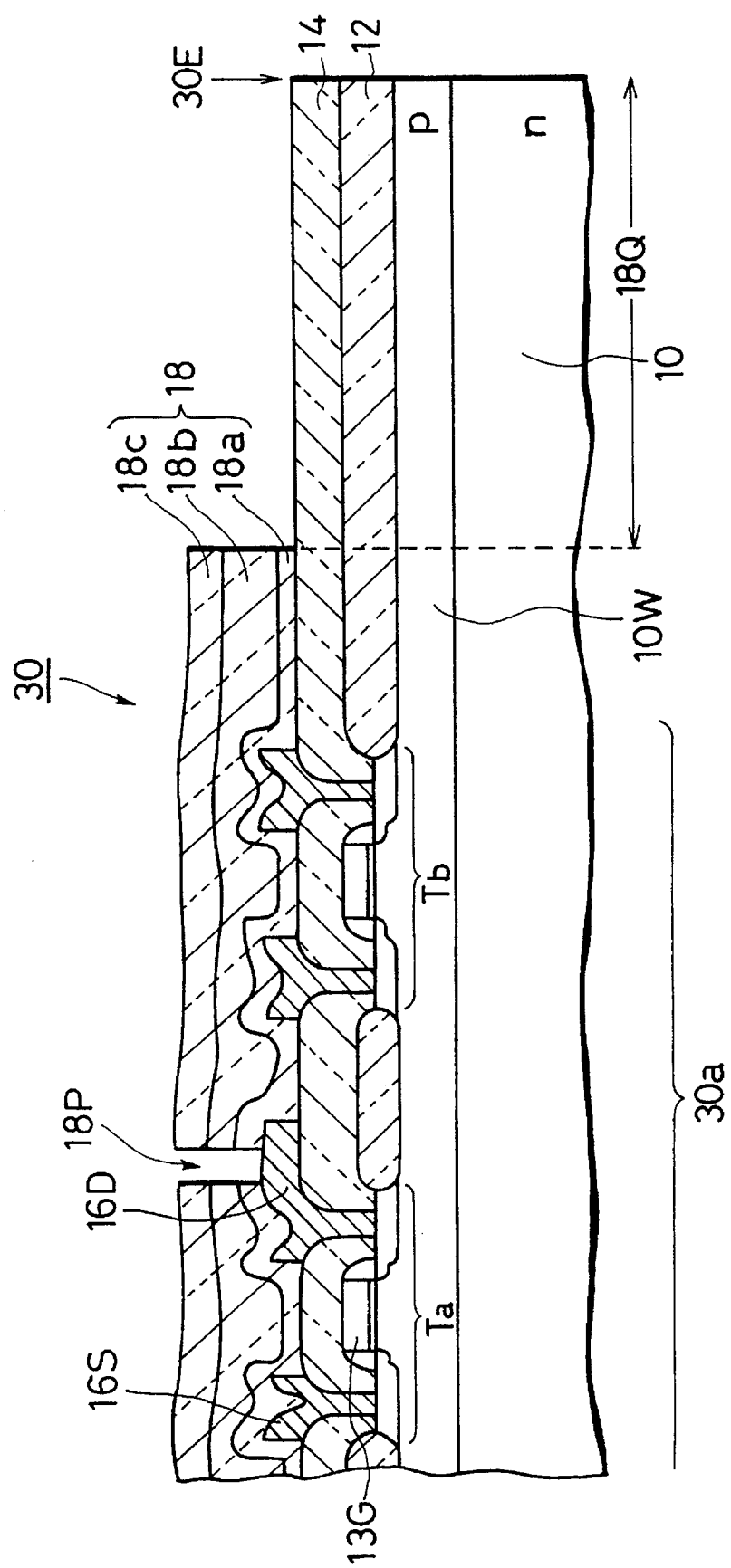
Figure 1J:
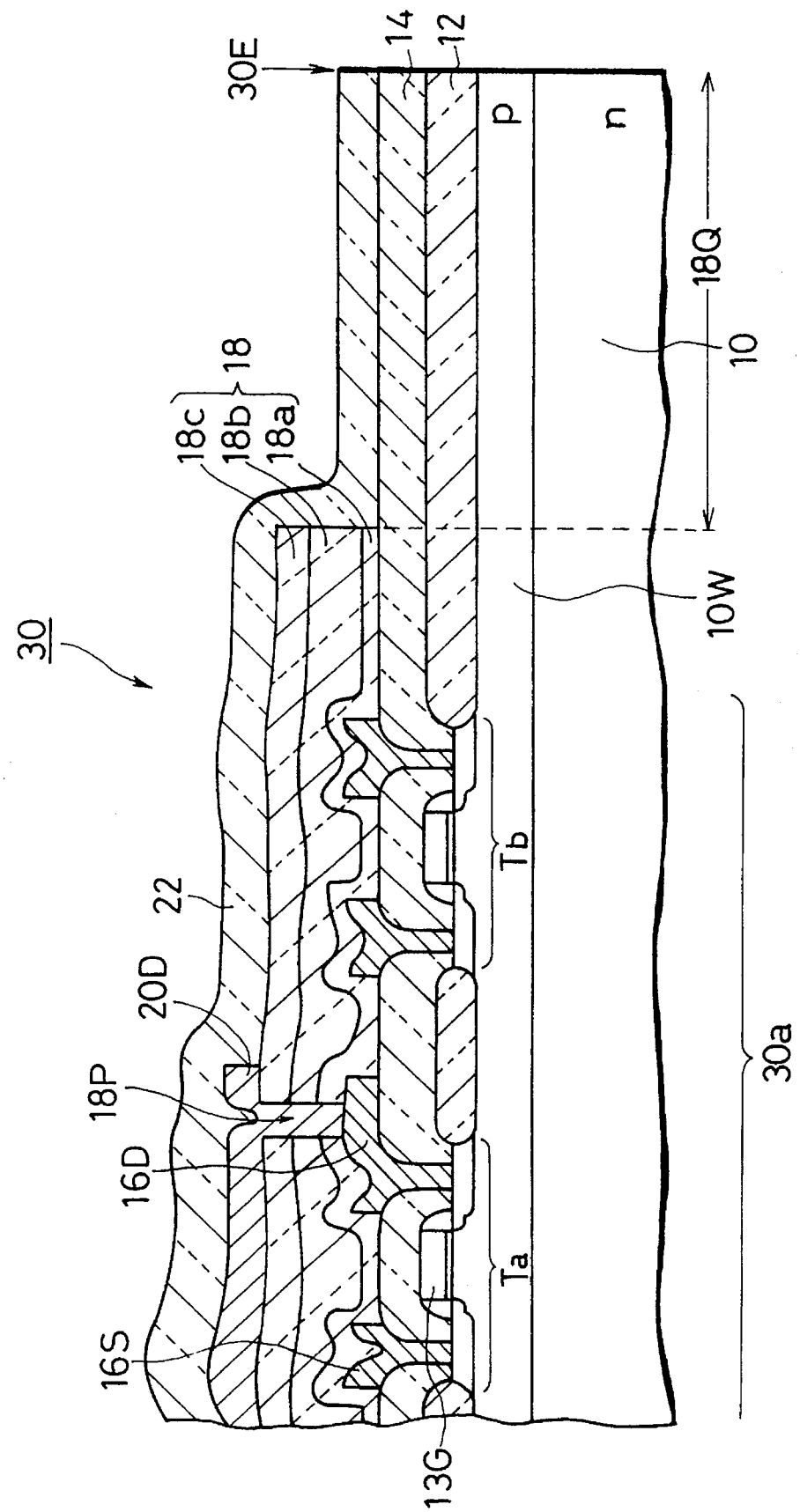

FIGS. 1H to 1J show the steps of a method of manufacturing an IC chip according to another embodiment of the invention. The same steps as FIGS. 1A to 1D are first performed. Thereafter, as shown in FIG. 1H, without removing the SOG film 18b, a silicon oxide film 18c is formed on the surface of the SOG film 18b to a thickness of 400 nm by plasma CVD.

Next, as shown in FIG. 1I, at the same time when a contact hole 18P is formed in the interlevel insulation film 18, the silicon oxide film 18a, SOG film 18b, and silicon oxide film 18c are partially removed to form a buffer region 18Q of a closed loop shape inside the chip periphery 30E and along the periphery of the element region 30a, as indicated by the hatching area shown in FIG. 2A. The chip area of FIG. 2A is distributed in a wafer as shown in FIG. 2B.

Next, as shown in FIG. 1J, a wiring layer 20D is formed by depositing an Al alloy film on the substrate surface by sputtering or the like and then patterning the Al alloy film. The wiring layer 20D is connected through the via hole 18P to the wiring layer 16D, and used as the drain wiring. Thereafter, a passivation insulation film 22 is formed on the substrate surface by depositing silicon nitride by plasma CVD.

According to this embodiment, the buffer region 18Q and via hole 18P are formed at the same time without increasing the number of manufacturing steps.

Figure 4:
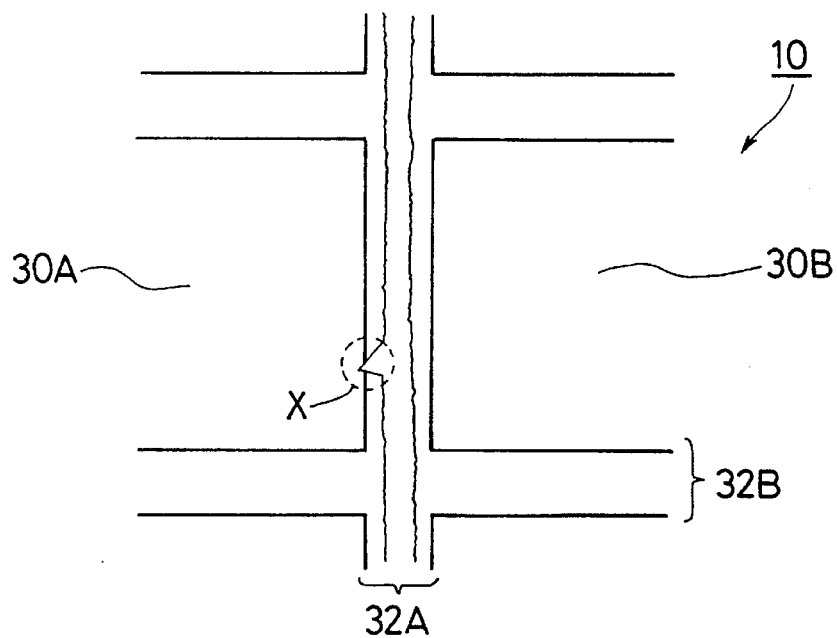
FIG. 4 is a top view of an element region layout on a substrate surface.

The wafer substrate processed in the above manner is diced along the scribing region as shown in FIG. 4 to obtain IC chips 30.

Even if a notch X such as shown in FIG. 4 is formed when dicing the wafer substrate, external water contents ($H_2O$) are intercepted by the buffer region 18Q and will not reach the element region 30a, because the SOG film 18b does not expose at the chip periphery 30E. A leak current between elements to be caused by conductivity inversion, or wiring corrosion to be caused by moisture invasion in the element region, can therefore be suppressed. Fixed positive charges to be caused by moisture invasion are not generated in the field insulation film 12 under the buffer region 18Q, thereby avoiding a malfunction of elements such as transistors Ta and Tb formed near at the chip periphery.

If a conventional seal ring structure shown in FIG. 3 is formed sufficiently inside of the chip periphery, it will mean that the scribing region becomes wide. In addition, even if the seal ring structure is formed sufficiently inside of the chip periphery, a possibility of forming a notch is not lowered because the wafer is allowed to be severed at any area within the scribing region, leaving a possibility that the notch reaches the ring seal structure and an SOG layer is exposed to moisture.

According to the embodiments, the SOG layer is retracted from the scribing region to form a buffer region between the scribing region and the device region. Although the adverse effects of a very large notch are not eliminated, the effects of a medium or small notch can be eliminated by the embodiment structure. Accordingly, without broadening the scribing region, the manufacturing yield can be improved and the number of chips obtainable from one wafer is not reduced.

The present invention has been described in connection with a limited number of preferred embodiments. The invention is not limited only to the above embodiments. For example, although the above embodiments use a single gate wiring layer and two metal wiring layers, the number of wiring layers may be changed as desired. For example, four polycrystalline Si wiring layers and two Al (alloy) wiring layers may also be used. As wiring materials, silicide and metal other than Al, such as Ti, W, and Mo may also be used. An interlevel insulation film using SOG is not limited to a single layer. If a plurality of SOG layers are used, the SOG layers are patterned so as not to leave them in the buffer region. As a substrate, a p-type semiconductor substrate may also be used.

It is apparent to those skilled in the art that various modifications, substitutions, combinations and the like can be made without departing from the scope of the appended claims.

I claim:

1. A method for manufacturing a semiconductor device, comprising the steps of:
   (a) providing a semiconductor wafer having a plurality of chip areas and scribe regions connecting the plurality of chip areas, each of the chip areas having an underlying structure;
   (b) forming a first insulating layer over the underlying structure of the plurality of chip areas;
   (c) forming a second insulating layer on the first insulating layer, the second insulating layer having moisture permeability; and
   (d) removing the second insulating layer from a periphery of the chip areas so that the second insulating layer is removed from the scribe region.

2. A method according to claim 1, further comprising the step of:
   (e) following the step (d), forming a third insulating layer on the second insulating layer.

3. A method according to claim 1, wherein the first insulating layer comprises silicon dioxide.

4. A method according to claim 2, wherein the third insulating layer comprises silicon dioxide.

5. A method according to claim 1, wherein the second insulating layer comprises spin-on-glass.

6. A method according to claim 1, wherein the underlying structure comprises field effect transistor and electrodes connected to source and drain thereof.

7. A method according to claim 1, wherein in the step (d), the second insulating layer is removed from the periphery of the chip areas with a closed loop configuration.

8. A method according to claim 7, wherein a width of removed second insulating layer from an edge of the chip areas is about 50 micrometers.

9. A method for manufacturing a semiconductor device, comprising the steps of:
   (a) providing a semiconductor wafer having a plurality of chip areas and scribe regions connecting the plurality of chip areas, each of the chip areas having an underlying structure;
   (b) forming an insulating layer having a laminated structure over the underlying structure of the plurality of chip areas, the insulating layer including at least one insulating sublayer having moisture permeability;
   (c) forming a hole through the insulating layer; and
   (d) simultaneous with the step (c), removing the insulating layer from a periphery of the plurality of chip areas.

10. A method according to claim 9, wherein the step (b), further comprising the steps of:
    (b-1) forming a first insulating layer over the underlying structure;
    (b-2) forming a second insulating layer over the first insulating layer, the second insulating layer having moisture permeability; and
    (b-3) forming a third insulating layer over the second insulating layer.

11. A method according to claim 10, wherein the first and third insulating layers comprises silicon dioxide.

12. A method according to claim 10, wherein the second insulating layer comprises spin-on-glass.

13. A method according to claim 10, wherein in the step (b-2), the second insulating layer is removed from the periphery of the chip areas with a closed loop configuration.

14. A method according to claim 13, wherein a width of removed second insulating layer from an edge of the die areas is about 50 micrometers.

15. A method according to claim 9, wherein the underlying structure comprises field effect transistor and electrodes connected to source and drain thereof.

16. A method for manufacturing a semiconductor device, comprising the steps of:
    (a) providing a semiconductor wafer having a plurality of chip areas to be severed from the wafer as dies, the semiconductor wafer being sectionalized into device regions and scribe regions provided between the device regions;
    (b) forming an insulating layer having a laminated structure over the underlying structure of the plurality of chip areas, the insulating layer having at least one insulating sublayer having moisture permeability; and
    (c) providing a buffer region between the device region and the scribe region.

17. A method according to claim 16, wherein said step (c) comprises:
    removing at least the insulating sublayer to provide the buffer region.

18. A method according to claim 17, wherein in the step (b), the buffer region resides on peripheries of the device regions with a closed loop configuration.

19. A method according to claim 18, wherein a width of the buffer regions is about 50 micrometers.

* * * * *